March 29, 1966 G. C. SZIKLAI 3,243,743
NEGATIVE REACTANCE TUNED CIRCUIT
Filed Oct. 20, 1960
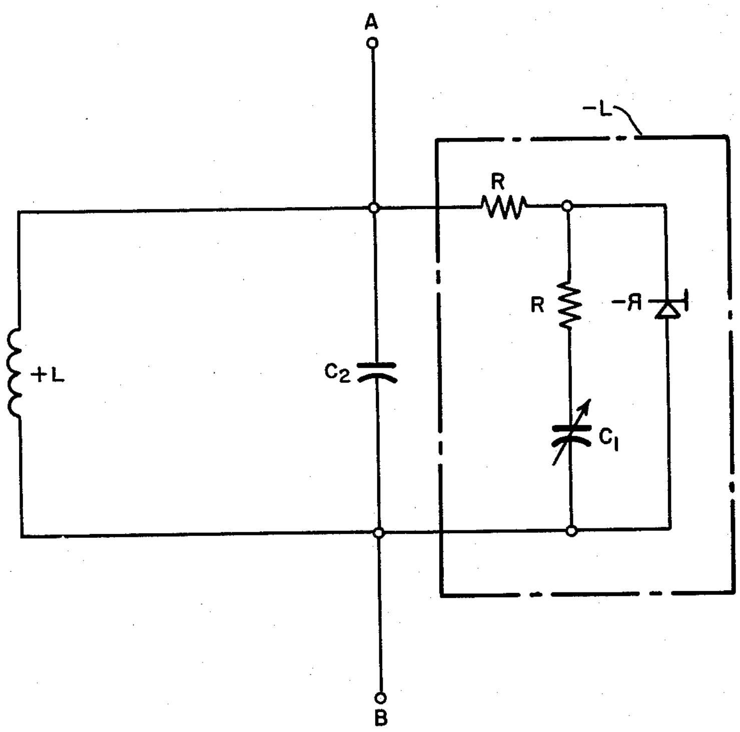
WITNESSES
Leon J. Laza
James F. Young
INVENTOR
George C. Sziklai
BY Ernest P. Klipfel
ATTORNEY 3,243,743
Patented Mar. 29, 1966

1

3,243,743

NEGATIVE REACTANCE TUNED CIRCUIT

George C. Sziklai, Carnegie, Pa., assignor to Westinghouse Electric Corporation, East Pittsburgh, Pa., a corporation of Pennsylvania Filed Oct. 20, 1960, Ser. No. 63,868
6 Claims. (Cl. 334—78)

The present invention relates generally to negative reactance tuned circuits and more particularly to a negative reactance tuned circuit which is tunable by varying a capacitance within the circuit.

I have shown in a publication entitled "Cathode-Coupled Wide-Band Amplifiers" by A. C. Schroeder and myself, page 709, reprinted from Proceedings of the Institute of Radio Engineers, October 1945, that the bandwidth of the conventional parallel tuned resonant circuit is inversely proportional to the product of a shunt capacitance and resistance. Accordingly, a conventional parallel resonant circuit tuned by a variable capacitor will change its bandwidth inversely with the tuning capacitance and in proportion to the square of the center frequency. Because of this phenomena in television and radar equipment, the inductances are changed instead to maintain a constant bandwidth. The present invention provides a negative reactance tuned circuit wherein the apparent parallel inductance between a negative inductance leg and a positive inductance leg is changed by varying the capacitance within the negative inductance leg. Other significant advantages result as well, as shown by the objects hereinafter.

An object of the present invention is to provide a new and improved tuning circuit.

Another object of the present invention is to provide a tuned circuit with a constant frequency bandwidth as controlled by a variable capacitance in a negative reactance leg of the tuned circuit.

Another object of the present invention is to provide a tuned circuit having a frequency variation which is proportional to the magnitude of capacitance in a negative reactance leg of the tuned circuit.

Another object of the present invention is to provide a tuned circuit allowing a greater variation of frequency with a given capacitance than the conventional tuned circuit.

Further objects and advantages will be readily apparent from the following detailed description taken in conjunction with the sole figure which is a schematic diagram of an illustrative embodiment of the present invention.

As claimed and more fully described in my copending application Serial No. 63,867, filed October 20, 1960, and assigned to the same assignee, an inductance enhancing network capable of increasing the inductance of the enhancing network to an extremely large value can be made by combining a positive inductance and a negative inductance; the negative inductance being a combination of a capacitance, two positive resistance elements and a negative resistance element, as provided by a tunnel diode. By enhancing the inductance of the parallel tuned circuit in accordance with the present invention many major advantages in performance and physical size can be obtained.

A tuned circuit in accordance with the present invention has a positive inductance L, a negative inductance —L, and a capacitance $C_2$ all connected in a parallel

2 circuit combination across the terminals A, B of the tuned circuit. The negative reactance —L comprises a series circuit combination of a first positive resistance R and a variable capacitance $C_1$. A negative resistance element $-\mathfrak{R}$ in the form of a tunnel diode is connected across the series circuit combination; all of which is connected in series circuit relationship with a second positive resistance R across the terminals A, B of the tuned circuit. It is to be understood that the tunnel diode has a voltage thereacross of sufficient magnitude to cause it to be biased into the negative region of its voltage-current characteristic curve.

It can be shown that the resonant frequency of a tuned circuit takes the form:

$$f_r=\frac{1}{2\pi\sqrt{LC}} \quad (1)$$

The resonant frequency of the tuned circuit shown in the figure then is:

$$f_r=\frac{1}{2\pi\sqrt{L_eC_2}} \quad (2)$$

where $L_e$ is the enhanced inductance across the terminals A, B as provided by the parallel combination of the positive inductance +L and the negative inductance —L.

The enhancement of the inductance of a network has been described and claimed in my aforementioned copending application Serial No. 63,867 wherein the enhanced inductance of the parallel combination of +L and —L takes the form:

$$L_e=\frac{LCR^2}{CR^2-L} \quad (3)$$

Substituting Equation 3 into Equation 2 it can be seen that the resonant frequency for the circuit shown in FIG. 1 is determined by the capacitance $C_2$ and a parallel inductance combination of L and $C_1R^2$, as shown by:

$$f_r=\frac{1}{2\pi\sqrt{\frac{C_1C_2R^2L}{C_1R^2-L}}} \quad (4)$$

The capacitance $C_1$ in the negative reactance leg, to tune to a frequency corresponding to an angular velocity $\omega$ can be obtained from Equation 5:

$$C_1=\frac{L}{R^2(1-C_2L\omega^2)} \quad (5)$$

Thus, when a negative inductance —L is placed in parallel within a tuned circuit with an inductance L and capacitance $C_2$, as shown in the figure, the apparent parallel inductance can be changed by varying the capacitance $C_1$ in the negative inductance leg, and hence an effective variation of the resonant frequency can be obtained maintaining a constant bandwidth.

Upon examining Equation 5 it is to be noted that if $\omega^2$ is equal to the reciprocal of $C_2L$ (which is the resonance of a conventional tuned circuit without the negative reactance), the second part of the parenthesis in the denominator becomes 1 and the variable capacitance $C_1$ becomes infinitive. This can be readily appreciated from the fact that under this condition the positive and negative resistances are in parallel and thus provide an open circuit. Under any other condition, the capacitance $C_1$ will influence the resonant frequency by making it lower than it would be if only the positive inductance L and capacitance $C_2$ would be used. Hence, the conventional tuned circuit can be considered as resonant to a frequency $n^2$ times higher than the tuned circuit in accordance with the present invention, as may be seen by Equation 6.

$$(n\omega)^2=\frac{1}{LC_2} \tag{6}$$

By substituting Equation 6 into Equation 5 the expression for the capacitance $C_1$ is given in terms of the positive inductance L, the square of the resistances R and the frequency multiplying factor $n$, as shown in Equation 7.

$$C_1=\frac{L}{R^2\left(1-\frac{1}{n^2}\right)}$$

$$C_1=\frac{L}{R^2}\cdot\frac{n^2}{n^2-1} \tag{7}$$

If the frequency range tunable by the variation of the capacitance $C_1$ is desired, it may be established by assuming that the maximum frequency $\omega_m$ is $m$ times higher than the value obtained with the minimum capacitance as shown in Equation 8

$$\omega_m{}^2=\frac{m^2}{n^2LC_2} \tag{8}$$

According to this assumption, by substituting the value obtained in Equation 8 into Equation 5 a value for the maximum capacitance is:

$$C_m=\frac{L}{R^2\left(1-\frac{m^2}{n^2}\right)}$$

$$C_m=\frac{L}{R^2}\cdot\frac{n^2}{n^2-m^2} \tag{9}$$

Therefore, the frequency of the tuned circuit is increased with an increase in the capacitance $C_1$, which is contrary to a tuned circuit of the prior art wherein the frequency varies as the square root of the capacitance. In other words, in a conventional tuning circuit, the capacitance has to be reduced by a ratio of the square of the frequency while the present invention provides a tuned circuit wherein the capacitance has to be increased and, as will be shown hereinafter, by a smaller amount.

The ratio, $\overline{R}$, of the maximum and minimum capacitance is given by $$\overline{R}=C_m/C_1=\frac{n^2-1}{n^2-m^2} \tag{10}$$

which is obtained by dividing Equation 9 with Equation 7. It is immediately apparent that depending on the value of $n$, $\overline{R}$ may be smaller or larger than $m$. Accordingly a frequency variation greater than the capacitance variation can be obtained. It is to be noted that to make the capacitance variation equal to the frequency variation, for which a substitution in Equation 10 of $\overline{R}$ equal to $m$ can be made, the cubic Equation 11 results.

$$m^3-n^{2m}+n^2-1= \tag{11}$$

Equation 11 has three roots, thus providing the relationship of equal frequency to capacitance ratio at three points, and the design value of $n$ may be obtained by solving the same equation for $n$ as shown by the following equation:

$$n=\sqrt{\frac{m^3-1}{m-1}} \tag{12}$$

Thus, it is readily apparent that the present invention has provided a tuning circuit having major advantages which may be summarized as follows:

It provides a constant bandwidth when tuned with a variable capacitance in the negative reactance leg.

It provides a frequency variation which is proportional to the capacitance.

Finally it can provide a greater variation of frequency with a given capacitance which is then the conventional tuned circuit.

While the present invention has been described with a particular degree of exactness of the purposes of illustration, it is to be understood that all equivalents, modifications, and alterations within the spirit and scope of the present invention are herein meant to be included.

I claim as my invention:

1. A negative reactance tuned circuit including two terminals, comprising, in combination: a parallel circuit combination connected across said terminals and including a positive inductance leg and a capacitance leg; a negative inductance leg connected across said parallel circuit combination; said negative inductance leg including variable capacitance means for varying the apparent parallel inductance across said terminals.

2. A negative reactance tuned circuit including two terminals comprising, in combination: a parallel circuit combination connected across said terminals including a positive inductance leg and a capacitance leg; a negative inductance leg connected across said parallel circuit combination; said negative inductance leg comprising a series circuit combination of a variable capacitance and a positive resistance element, a negative resistance element connected across said series circuit combination, a series circuit relationship comprising a second positive resistance and said series circuit combination connected across said terminals; and means for changing said variable capacitance for varying the apparent parallel inductance across said terminals.

3. A negative reactance tuned circuit including two terminals comprising, in combination: a parallel circuit combination connected across said terminals including a positive inductance leg and a capacitance leg; a negative inductance leg connected across said parallel circuit combination; said negative inductance leg comprising a series circuit combination of a variable capacitance and a positive resistance element, a negative resistance element connected across said series circuit combination, a series circuit relationship comprising a second positive resistance and said series circuit combination connected across said terminals; and means for increasing the magnitude of said variable capacitance whereby the frequency of said tuned circuit is increased.

4. A two terminal negative reactance tuned circuit comprising, in combination: a positive inductance and a first capacitance connected in shunt relationship across said terminals; a variable capacitance; negative inductance means operatively connected across said shunt combination responsive to the magnitude of said variable capacitance for providing a constant bandwidth over a predetermined magnitude range of said variable capacitance.

5. A two terminal negative reactance tuned circuit comprising, in combination: a positive inductance and a first capacitance connected in shunt relationship across said terminals; a variable capacitance; negative inductance means operatively connected across said shunt combination and proportionally responsive to the magnitude of said variable capacitance for varying the frequency of said tuned circuit.

6. A two terminal negative reactance tuned circuit comprising, in combination: a parallel circuit combination including an inductance and a first capacitance connected across said terminals; a negative inductance connected across said parallel circuit combination; said negative inductance comprising a series circuit combination of a second capacitance and a first positive reistance, a negative resistance connected across said series circuit combination, a second positive resistance connecting one end of said series circuit combination to one terminal, the opposite end of said series circuit combination connected to the opposite terminal; the magnitude of said negative resistance preselected to be substantially equal to the magnitude of each said positive resistance; and means for varying the magnitude of said second capacitance whereby a constant bandwidth is provided across said terminals.

References Cited by the Examiner

UNITED STATES PATENTS

| | | | |
|---|---|---|---|
| 2,788,496 | 4/1957 | Linvill | 333—80 |
| 2,933,703 | 4/1960 | Kinariwala | 333—80 |

FOREIGN PATENTS

| | | |
|---|---|---|
| 278,036 | 9/1927 | Great Britain. |

OTHER REFERENCES

IRE Proceedings, July 1959, pp. 1268 and 1269 relied on.

Schultz, "Amplifier Design," May 27, 1960, Electronics, pp. 110–112 relied upon.

Sommers, "Tunnel Diodes," Proceeding of IRE, July 1959, pp. 201–206.

Verman, "Negative Circuit Constants," Proceedings, Inst. of Radio Eng., April 1931, vol. 19, No. 4, pp. 676–681.

HERMAN KARL SAALBACH, *Primary Examiner.*

BENNETT G. MILLER, *Examiner.*